United States Patent [19]
Mashikian et al.

[11] Patent Number: 5,448,176
[45] Date of Patent: Sep. 5, 1995

[54] CABLE FAULT DETECTION USING A HIGH VOLTAGE ALTERNATING POLARITY DC SIGNAL SUPERPOSED WITH A SYSTEM FREQUENCY AC SIGNAL

[75] Inventors: Matthew S. Mashikian, Storrs; Robert B. Northrop, Chaplin; Dong Sui, Storrs, all of Conn.

[73] Assignee: The University of Connecticut, Storrs, Conn.

[21] Appl. No.: 175,628

[22] Filed: Dec. 30, 1993

[51] Int. Cl.$^6$ .......................................... G01R 31/08
[52] U.S. Cl. .................................... 324/551; 324/544
[58] Field of Search ............... 324/508, 533, 539, 541, 324/543, 544, 551, 532, 534, 535; 340/647

[56] References Cited

U.S. PATENT DOCUMENTS

| | | | |
|---|---|---|---|
| 4,721,916 | 1/1988 | Hanasawa et al. | 324/544 |
| 4,766,386 | 8/1988 | Oliver et al. | 324/527 |
| 4,825,171 | 4/1989 | Lefeldt | 324/544 |
| 4,887,041 | 12/1989 | Mashikian et al. | 324/541 |
| 4,896,117 | 1/1990 | Floweredew et al. | 324/529 |
| 4,980,645 | 12/1990 | Soma et al. | 324/544 |
| 5,266,902 | 11/1993 | Kovacich et al. | 324/537 |
| 5,276,401 | 1/1994 | Soma et al. | 324/544 |

OTHER PUBLICATIONS

M. S. Mashikian, "To Test or Not To Test Field Age Medium Voltage Cables", Presented at APPA Annual Meeting, Mar. 9–11, 1993, Phoenix, Arizona.
J. P. Steiner, "Novel Insulation Testing Methods" Presented at EIRC (Univ. of Conn.) Fall Workshop, Oct. 1992, Windsor, Conn.
H. R. Gnerlich, "Effects of HV Testing and Fault Locating on Power Cables with Solid Dielectric Insulation" Presented at ETRC (Univ. of Conn.) Fall Workship, Oct. 1992, Windsor, Conn.
B. S. Bernstein "Effect of DC Testing on Extruded Solid Dielectric XLPE–Insulated Cables Operating Under AC" Presented at EPRI (Univ. of Conn.) Workshop, Oct. 1982, Windsor, Conn.
D. D. Sammon, "Cable Testing and Diagnostic Practices" Presented at EIRC (Univ. of Conn.) Workshop, Oct. 1992 Windsor Conn.
L. J. Kelly, "High-Voltage Testing of Medium–Voltage Shielded Power Cables" IEEE Transactions on Industry Applications, vol. 26, No. 4, Jul./Aug. 1990.
C. F. Steennis, E. Hertzel and W. Boone "Diagnostic Site-Testing for Medium–Voltage Extruded Cables" Presented at the 91st Meeting of IEEE Power Eng. Society Jul. 20–23, 1992, Birmingham, England.
C. S. Eager, B. Fryszczyn, C. Katz, H. A. El Balady, and A. R. Jean "Effect of D.C.–Stressing Water Tree Deteriorated Cables", Proceedings of 91st Meeting, IEEE Insulated Conductors Committee, Birmingham, England, Jul. 20–23, 1992.

*Primary Examiner*—Kenneth A. Wieder
*Assistant Examiner*—Christopher M. Tobin

[57] ABSTRACT

Test apparatus for a high voltage cable installation includes a high AC voltage source having the frequency range intended to be carried by the cable installation and a high DC voltage source. A switch alternately passes positive and negative polarities of the DC voltage, and the AC voltage source and the alternating polarity DC voltage output from the switch are coupled while isolating the voltage sources from each other. The resulting alternating polarity DC-biased AC voltage is injected into the cable installation to produce indications of incipient faults.

16 Claims, 8 Drawing Sheets

CABLE FAULT DETECTION USING A HIGH VOLTAGE ALTERNATING POLARITY DC SIGNAL SUPERPOSED WITH A SYSTEM FREQUENCY AC SIGNAL

BACKGROUND OF THE INVENTION

The present invention relates to the testing of high voltage cable installations and, more particularly, to an apparatus and method for providing a high voltage to be injected into a cable installation to permit identification of incipient faults.

Electrical power equipment and systems should be tested on-site prior to their initial energization and periodically during their service life to ensure that defective components leading to service failures are identified and repaired. Although this is true for all types of high voltage power equipment, this is particularly important for power cables.

In testing a cable, a voltage equivalent to several times its normal rated value is impressed upon its insulation for a predetermined time duration to determine one or more of the following:

(a) whether the cable survives the test without failure b) the leakage current as a function of time and the voltage applied c) the dissipation factor of the cable insulation d) the existence, and location of any partial discharge (PD)

e) any other characteristic relevant to the cable operation

The best method for testing the cable utilizes an alternating voltage (AC) at the intended power frequency (50 or 60 Hz) because this corresponds to the real service condition. If a long cable (several thousand feet in length) intended for a 15 Kv system or higher is to be tested at an AC voltage equivalent to three times its service voltage level, a very bulky, heavy and expensive test transformer would be required, generally weighing in excess of 3,000 pounds and costing over $50,000.

In an effort to provide an alternative approach, several different field testing strategies have been adopted in the past.

DC Voltage Test

A DC voltage test system capable of testing the several thousand feet of cable at three times rated voltage may weigh less than 300 lbs. and cost less than $5,000. This is ideally suitable as a portable test set for use in the field, and long cables generally have been tested in the field with a DC voltage.

However, a DC voltage test has many disadvantages. It does not correctly reproduce the breakdown mechanisms which are responsible for cable failure under normal service (AC) voltage conditions. DC voltage tests may not be able to detect certain defects which will cause early failure in service; e.g., partial discharge (PD), which is a major failure mechanism, cannot be induced repeatedly in a cable with pure DC voltage. Under application of DC voltage, a cable defect may emit a PD pulse once every several hours, a situation which will not permit effective detection and location of such defects. Moreover, DC voltage testing may introduce extraneous charges in a cable, precipitating undesirable early failures under normal service conditions following the testing.

Resonant AC Test

The ideal test condition has always been viewed as the application of AC voltage at the normal power frequency (50 or 60 Hz). High voltage at power frequency can be generated by means of somewhat smaller transformers if the cable to be tested is made to resonate with a variable inductor in the test set. The weight and cost of these sets are relatively high.

A recent method (pulsed resonant AC system), advocated by AVO Biddle Company, is described as producing high AC voltages by means of relatively small (less than 1000 lbs.) transformers. This method is still in the experimental stage, and it is difficult to predict its performance and ultimate costs. However, it is anticipated that its cost will be relatively high because it is significantly more complex than a simple high voltage source.

Very Low Frequency (VLF) Test

Some commercial test sets are capable of producing high voltage at a low frequency (0.1 Hz); and they are relatively small and their cost is within affordable limits. However, from a technical viewpoint, they do not induce the same failure mechanisms as encountered in normal service at the service frequency. For instance, it may not be possible to generate partial discharges in a device by means of VLF until the voltage is elevated to much higher levels than would produce PD signals with a current source at the intended operating frequency. Nevertheless, in the absence of a better affordable method, the VLF has been gaining wider acceptance in the industry.

Impulse Voltage Test

This test simulates the action of short duration, high voltage surges such as lightning. Although it has been used in the field under some special conditions, its on-site use is not practical and it has not gained popularity. Moreover, it is not possible to perform PD tests by means of this voltage.

Accordingly, it is an object of the present invention to provide a novel test apparatus for providing a unique high voltage source for testing of high voltage installations in the field.

It is also an object to provide such test apparatus which is relatively simple and economical to fabricate and which is reliable in operation.

Another object is to provide a novel method for generating a high voltage field for injection into high voltage installations for testing thereof.

A further object is to provide such a high voltage testing method which is relatively simple to conduct and which provides results comparable to those obtained from the application of high AC voltage.

SUMMARY OF THE INVENTION

It has now been found that the foregoing and related objects may be readily attained in test apparatus for high voltage cable installations, which includes a source of high AC voltage of the frequency range intended to be carried by the cable installation, a source of high DC voltage, and switch means for alternately passing positive and negative polarities of the DC voltage.

The AC voltage source and the alternating polarity DC voltage output from the switch means are coupled by the coupling means including isolation means in the current paths from the AC voltage source and the DC voltage switch means to isolate the sources from the other, whereby the alternating polarity DC voltage and AC voltage are superimposed. The test apparatus further includes means for introducing the superimposed voltages into a cable installation to produce indications of incipient faults therein.

Generally, the voltage sources will include a transformer, and this may be a common transformer with AC and DC high voltage portions providing respectively the high DC voltage to the switch means, and the high AC voltage.

Desirably, the isolation means includes an AC coupling capacitor in the AC voltage path and resistors in the DC voltage path from the switch means. The switch means is conveniently a relay or semiconductor controlled by an adjustable timer.

Preferably, the apparatus also includes means for monitoring the superimposed voltages, and means for varying the peak voltage of the two voltage sources.

DETAILED DESCRIPTION OF THE ILLUSTRATED EMBODIMENTS

Figure 1:
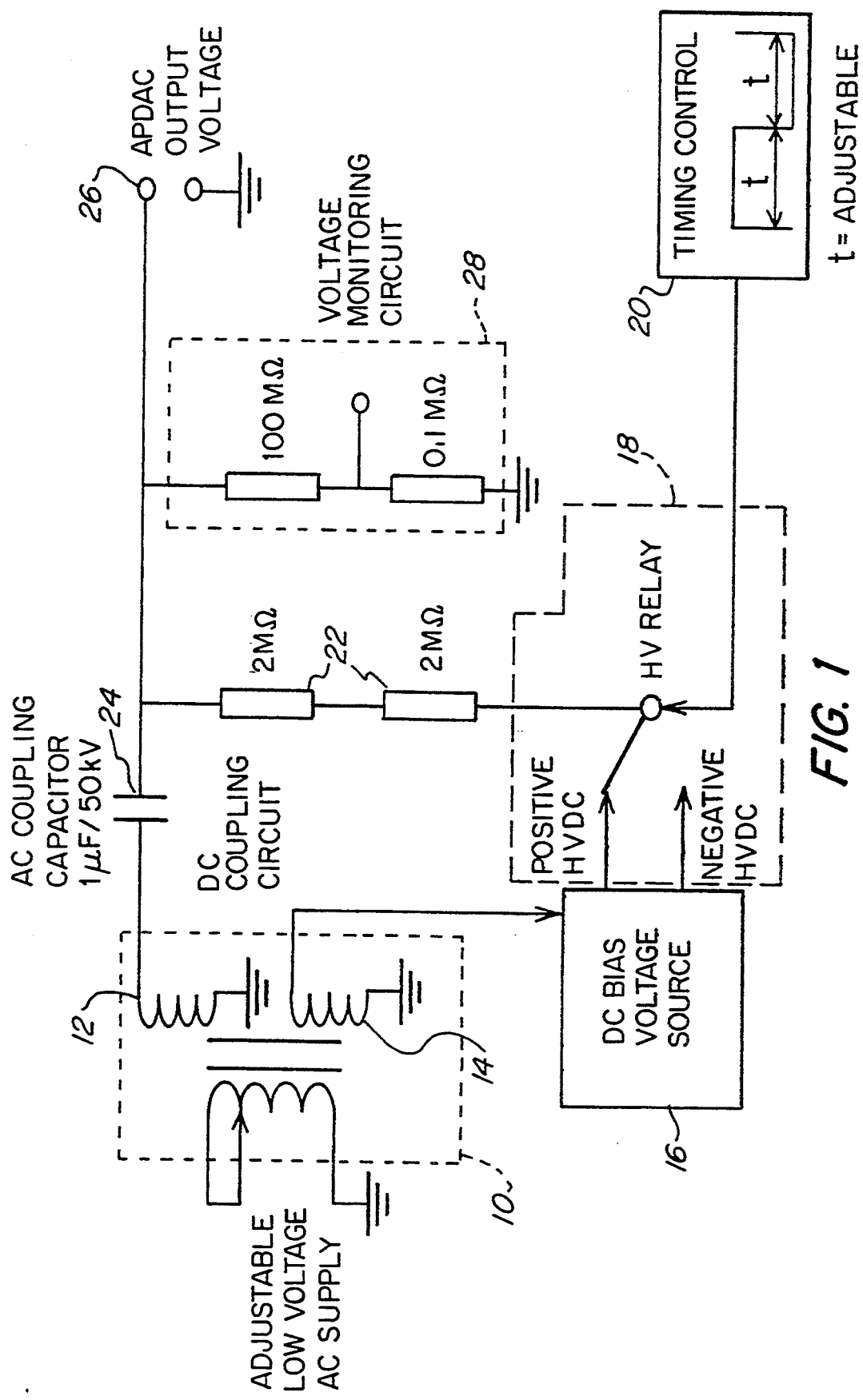
FIG. 1 is a simplified block diagram of test apparatus embodying the present invention for generating a high alternating polarity DC-biased AC (APDAC) voltage.

Turning first to FIG. 1, this simplified block diagram illustrates generally the components of the apparatus and the manner in which the AC and DC voltages are superimposed to produce an alternating polarity DC-biased AC (APDAC) voltage. As seen in this figure, alternating current is supplied to a transformer generally designated by the numeral 10 and having a pair of output coils 12,14. The stepped up DC voltage from the coil 14 is passed through the DC-biased voltage source 16 to provide negative and positive direct voltage outputs. The double throw high voltage relay switch 18 alternates between the positive and negative bias outputs in a time sequence determined by the adjustable timer 20, alternately supplying positive and negative DC voltages which pass through the resistors 22 to the line carrying the stepped up AC voltage from the coil 12 of the transformer 10. The AC and DC voltage sources are isolated from each other by the resistors 22 in the DC voltage line, and by the AC coupling capacitor in the AC voltage line. The superposed voltages or APDAC voltage then continues to the terminal 26 at which it would be injected into the cable installation to be tested (not shown). Also shown is the voltage monitoring circuit 28 to allow monitoring of the APDAC.

Figure 2:
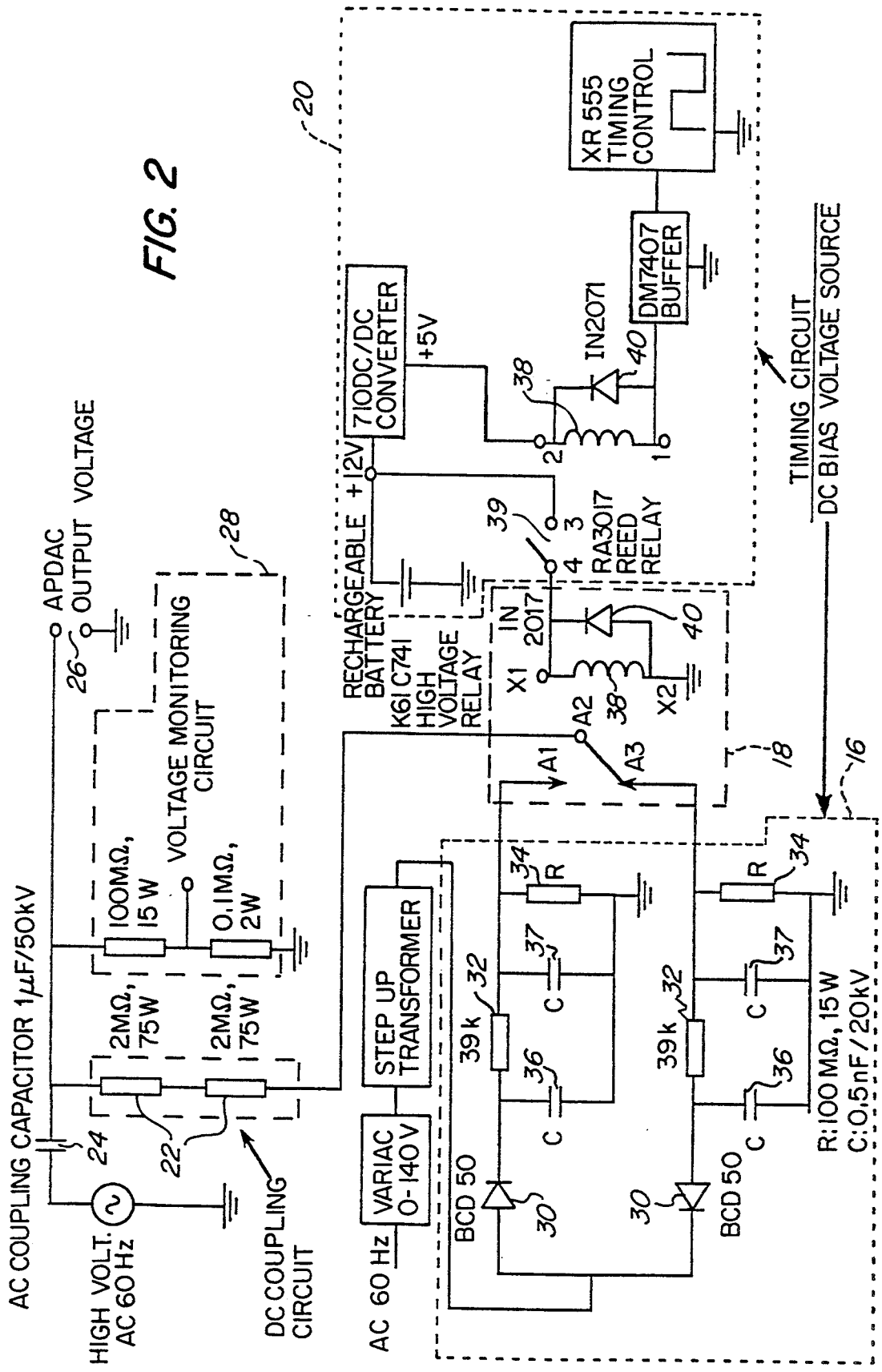
FIG. 2 is a circuit diagram of such apparatus showing in greater detail the circuitry of the DC voltage portion thereof.

Turning next to FIG. 2, therein illustrated is a circuit diagram showing in greater detail the components utilized in providing the alternating polarity DC voltage. As seen, the DC voltage bias 16 is effected by a circuit comprised of a pair of subcircuits, each including a diode 30, resistors 32,34 and capacitors 36,37. The high voltage relay switch 18 is actuated by a reed relay 39 operated by a pair of coils 38 energized through the diodes 40.

Figure 3:
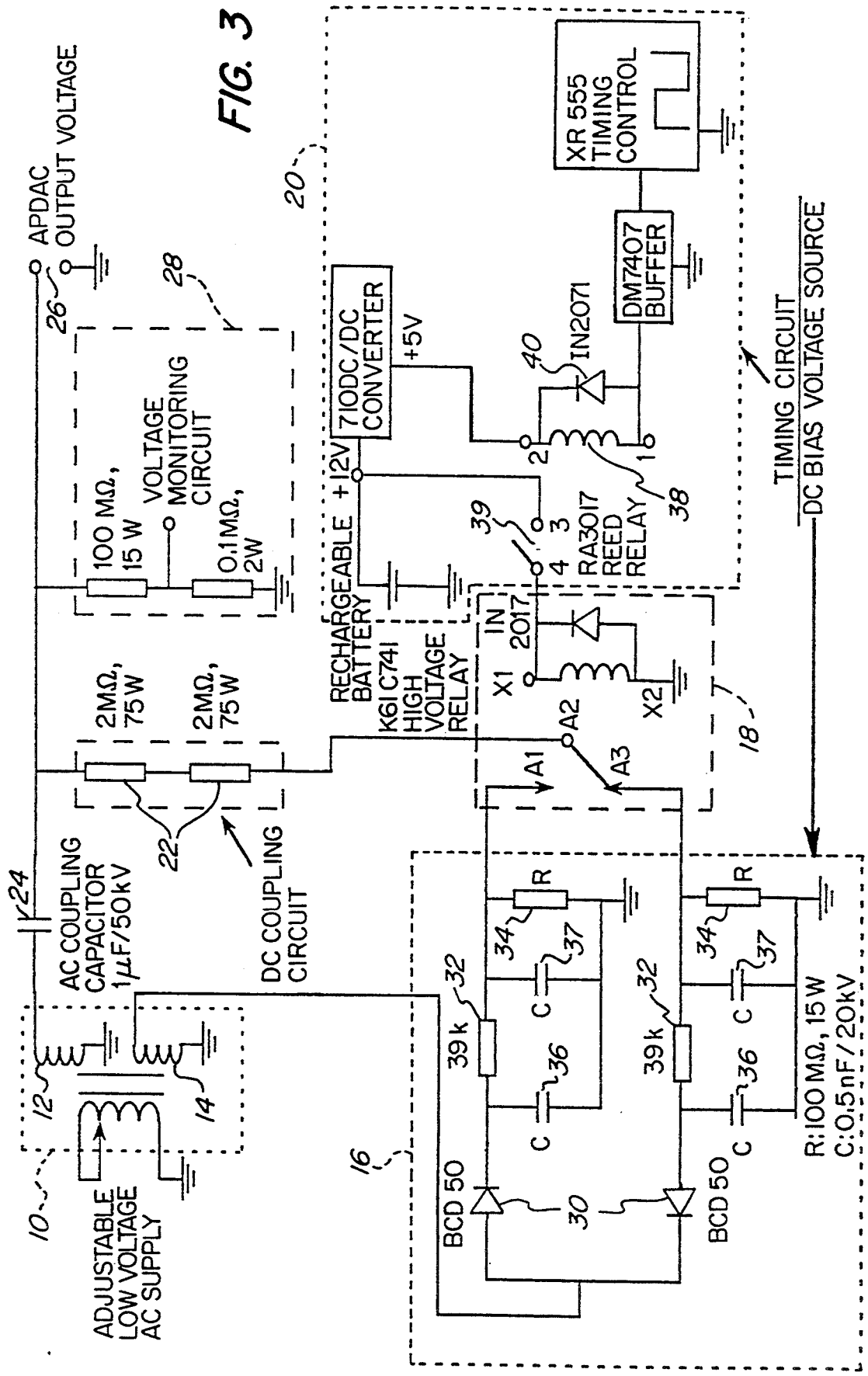
FIG. 3 is a circuit diagram similar to FIG. 2, but utilizing a single transformer with dual coils to provide the high AC and DC voltages.

FIG. 3 is a circuit diagram similar to FIG. 2, but utilizing a dual coil transformer 10 to provide both the stepped up AC and DC voltages as indicated in the block diagram of FIG. 1.

Figure 4:
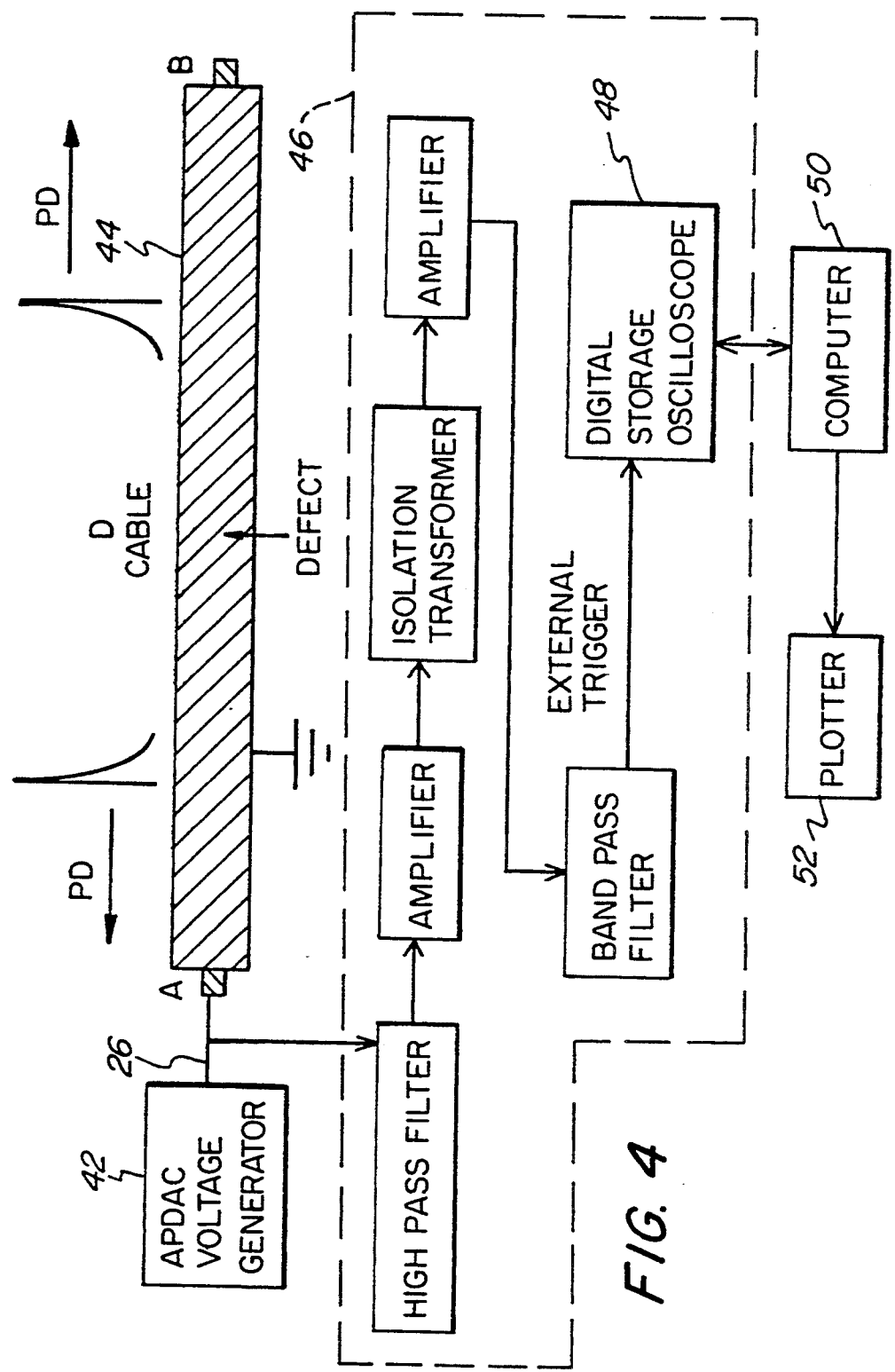
FIG. 4 is a schematic illustration showing the apparatus injecting its output voltage into a schematically illustrated cable, and the test instrumentation utilized to identify partial discharges in the cable.

Turning next to FIG. 4, this illustrates how the APDAC voltage apparatus of the present invention is combined with other instrumentation to detect partial discharges in a length of cable. The apparatus of the present invention, generally indicated by the numeral 42, is injected into an end of the cable 44 and the reflected pulses are detected, interpreted and graphically displayed by the instrumentation comprising the test instrument 46, the digital storage oscilloscope 48, the computer 50 and the plotter 52. Details concerning desirable instrumentation for this purpose are set forth in Mashikian et al U.S. Pat. No. 5,272,439 issued Dec. 21, 1993, and Mashikian et al. U.S. Pat. No. 4,887,041 granted Dec. 12, 1989. Other patents which describe apparatus for locating faults and power lines are illustrated and described in Springfield et al. U.S. Pat. No. 2,628,267, Bauer U.S. Pat. No. 3,244,975, Schluter U.S. Pat. No. 3,255,406, Lambertson U.S. Pat. No. 4,104,582 and Bellis et al. U.S. Pat. No. 4,491,782.

Figure 5:
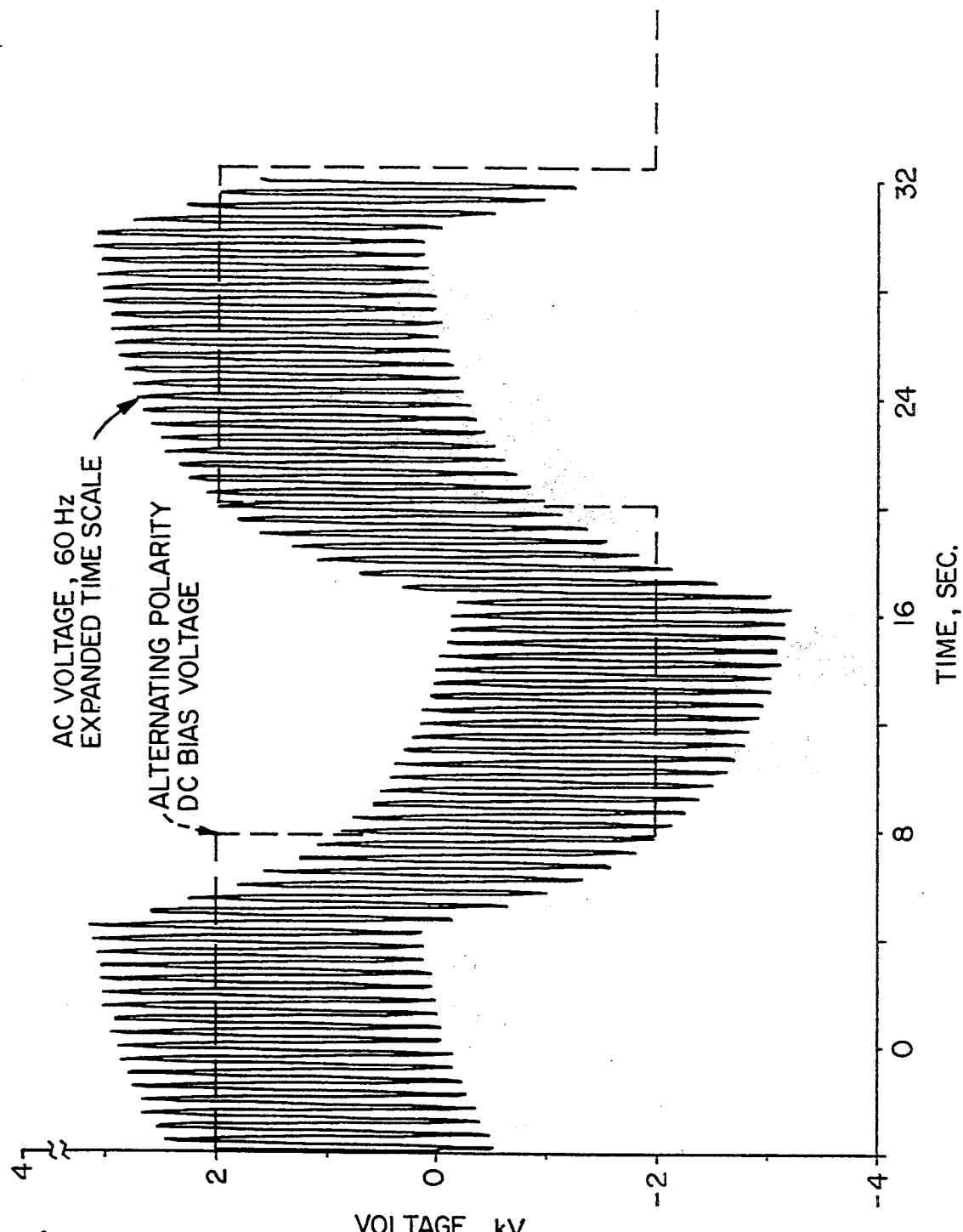
FIG. 5 is a graphic representation of an AC/DC voltage wave form generated by the apparatus and method of the present invention.

Turning now to FIG. 5, therein graphically presented is a wave form of the APDAC voltage produced by the apparatus and method of the present invention. The vertical lines represent the AC voltage and the slope of the array of the lines represents the effect of the DC voltage bias. The upwardly sloping portion represents the effect of the positive DC voltage and the downward slope represents the effect of the negative DC voltage. As can be seen, the DC voltage gradually climbs to its intended value according to an exponential curve, and then gradually falls as the DC voltage is changed from a positive bias to a negative bias.

To illustrate the efficacy of the APDAC voltage of the present invention as a means for determining partial discharges, a series of tests was conducted in which the test voltage was injected into a cable having a defect provided by 1/32 inch diameter hole through the outer shield and down to the insulation surface. The cable had a length of 3 feet and was a 15 kV URD cable. The point at which partial discharge could be detected was noted using pure AC voltage and various ratios of DC/AC APDAC voltage.

| PARTIAL DISCHARGE INCEPTION VOLTAGE | | | |
|---|---|---|---|
| Test | AC (rms, Kv) | AC (peak, Kv) | DC (Kv) | Total (Kv) |
| 1 | 9.2 | 13.0 | 0.0 | 13.0 |
| 2 | 7.0 | 9.9 | 1.9 | 11.8 |
| 3 | 6.6 | 9.3 | 2.9 | 12.2 |
| 4 | 6.1 | 8.6 | 3.9 | 12.5 |
| 5 | 5.8 | 8.2 | 5.0 | 13.2 |

As can be seen, pure AC voltage produced partial discharges at 9.2 Kv (rms) or 13 kV peak ($9.2 \times \sqrt{2}$) while the APDAC voltages produced partial discharges at significantly lower AC voltages. This table shows that the sum of the peak AC voltage and DC voltage required to produce a partial discharge is fairly constant (11.8–13 kV). Thus, by superposing the DC-biased voltage upon the AC voltage, the requirement for, and the size of the installation to produce, high AC voltage is significantly reduced.

Figure 6:
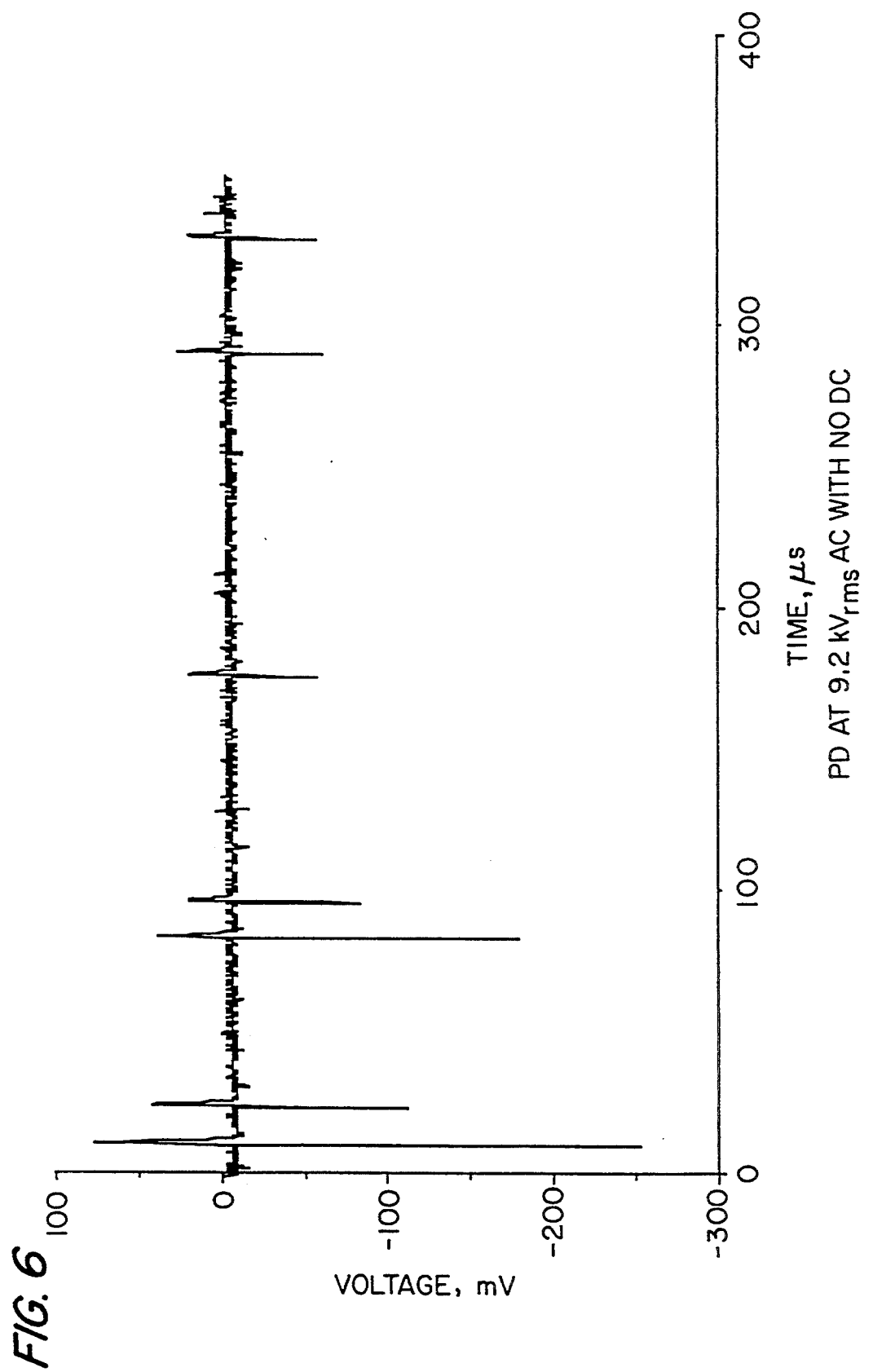
FIG. 6 is a graphic illustration of the partial discharge signals produced by pure AC voltage in a cable test installation.
Figure 7:
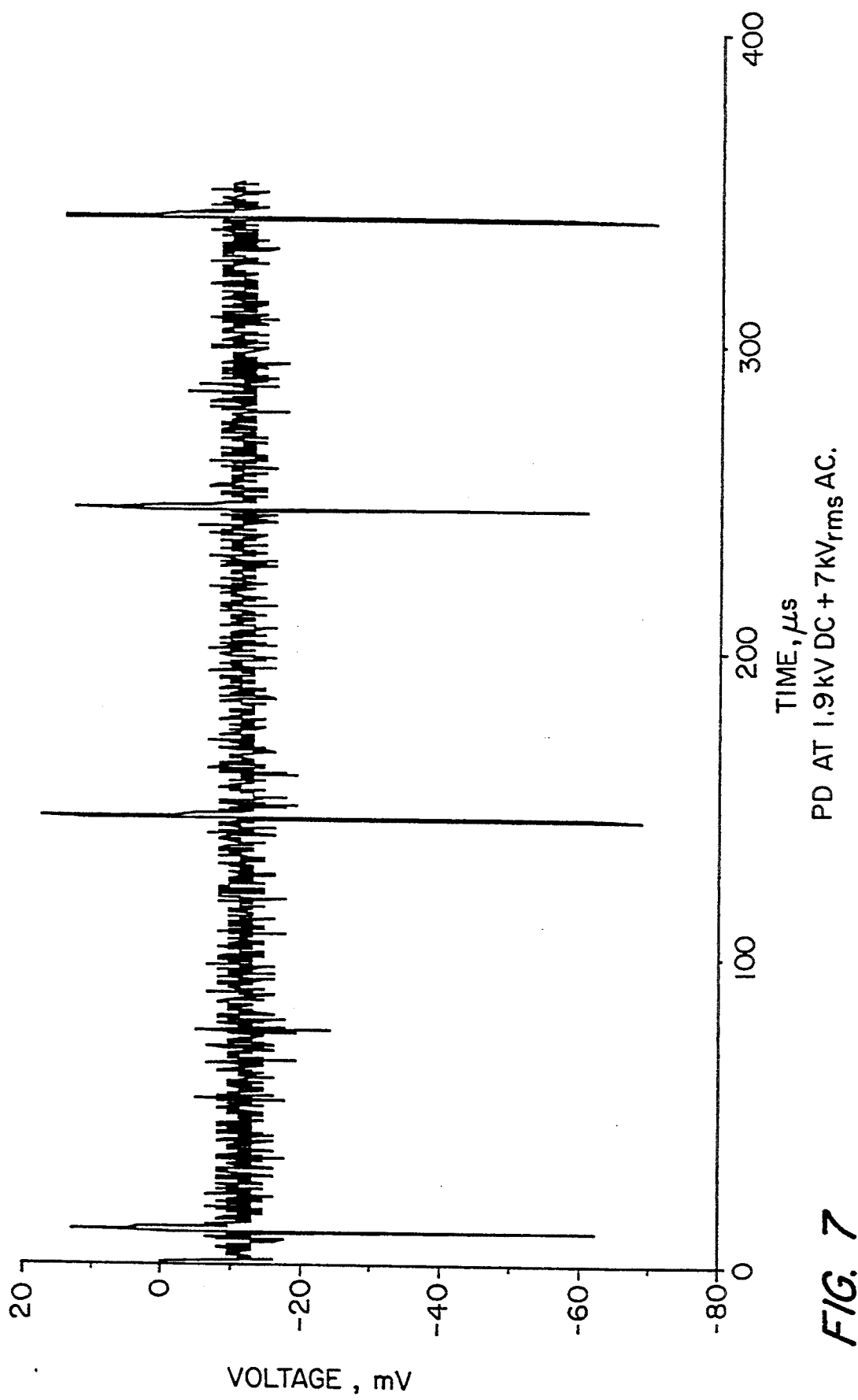
FIG. 7 is a similar illustration of the partial discharge signals produced by the APDAC voltage of the present invention in one ratio of AC voltage to DC voltage.
Figure 8:
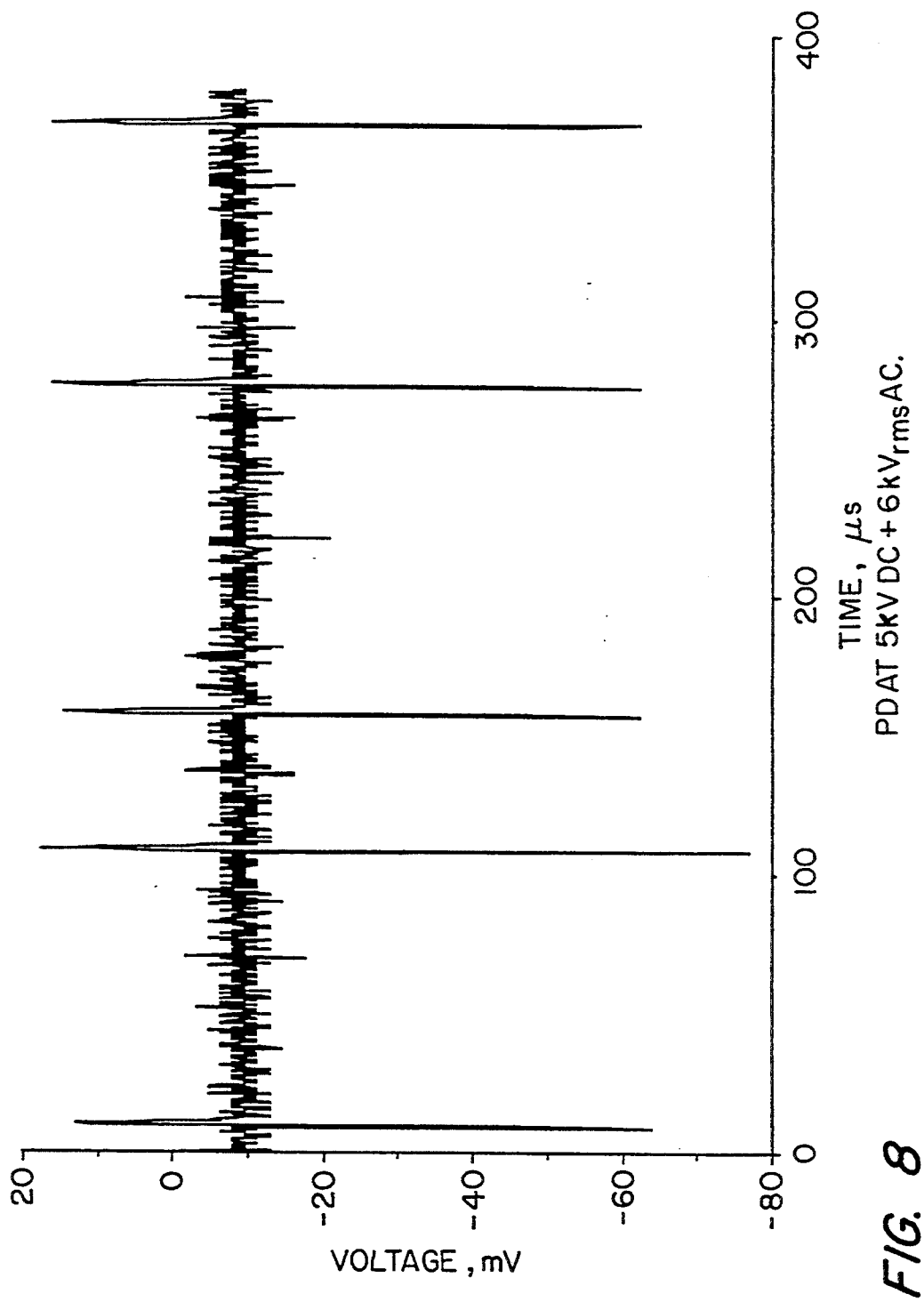
FIG. 8 is a similar view using another ratio of AC voltage to DC voltage.

FIGS. 6–8 graphically present the partial discharge signals obtained as a function of time. FIG. 6 represents the result of the application of pure AC voltage. FIGS. 7 and 8 represent two different ratios of the AC/DC voltage utilizing the APDAC voltage method of the present invention.

As can be seen, the APDAC voltage apparatus and method of the present invention combines the ideal voltage conditions of AC voltage to repetitively produce partial discharges, with the light weight and low cost of DC voltage generation to produce a test set which is of reasonable weight and produced at reasonable cost by eliminating the requirement for higher AC voltage. The failure mechanisms which result from the use of APDAC voltage appear similar to those prevailing under normal service conditions. Moreover, because the DC voltage component periodically alternates its polarity, there are no adverse residual charges in the cable which is being tested.

Thus, it can be seen that the apparatus and method of the present invention satisfy the requirements for producing repeated partial discharges in order to properly evaluate the service performance of a high voltage installation. The APDAC voltage electrically stresses at lower cost and with lower AC voltage requirements up to the threshold value for partial discharges. After each discharge, the time varying voltage allows the charges to move quickly back to the defective site by induction (capacitively). The present invention thus combines the DC voltage bias which is easy and cheap to produce, with the desired AC stress which is significantly smaller than if pure AC were being employed.

Thus, it can be seen from the foregoing detailed description and the attached drawings, that the apparatus and method of the present invention generate a highly desirable, alternating polarity DC-biased AC voltage which will reliably enable for the testing of high voltage installations for points of partial discharges. The apparatus may be fabricated at significantly lower cost than a pure AC test apparatus, and is lighter and easier to maintain. Moreover, no residual charges remain in the cable being tested.

Having thus described the invention, what is claimed is:

1. In a test apparatus for high voltage cable installations, the combination comprising:
   (a) a source of high AC voltage of the frequency range intended to be carried by the cable installation;
   (b) a source of high DC voltage;
   (c) switch means for alternately providing positive and negative polarities of said DC voltage to produce an alternating polarity DC voltage output;
   (d) conduits from said AC voltage source and said switch means for the AC voltage and for the alternating polarity DC voltage output;
   (e) coupling means in said conduits for coupling said AC voltage source and said alternating polarity DC voltage output from said switch means, said coupling means including isolation means in said conduits from said AC voltage source and said DC voltage switch means to isolate said sources from each other, whereby said alternating polarity DC voltage and AC voltage are superimposed to produce an alternating polarity DC-biased AC voltage; and
   (f) means for introducing said alternating polarity DC-biased AC voltage into a cable installation to produce indications of incipient faults in said cable installation.

2. The test apparatus in accordance with claim 1 wherein said AC and DC voltage sources include a transformer.

3. The test apparatus in accordance with claim 2 wherein said sources include a common transformer with AC and DC high voltage portions providing respectively said high DC voltage to said switch means, and high AC voltage.

4. The test apparatus in accordance with claim 1 wherein said isolation means includes an AC coupling capacitor in the AC voltage path and resistors in the DC voltage path from said switch means.

5. The test apparatus in accordance with claim 1 wherein said switch means is a relay controlled by an adjustable timer.

6. The test apparatus in accordance with claim 1 wherein said switch means is a semiconductor controlled by an adjustable timer.

7. The test apparatus in accordance with claim 1 wherein there is additionally included means for monitoring the alternating polarity DC-biased AC voltage.

8. The test apparatus in accordance with claim 1 wherein there is included means for varying the peak voltage of the two voltage sources.

9. In test apparatus for high voltage cable installations, the combination comprising:
   (a) a source of high AC voltage of the frequency range intended to be carried by the cable installation;
   (b) a source of high DC voltage, said current sources including at least one transformer;
   (c) switch means for alternately providing positive and negative polarities of said DC voltage source to produce an alternating polarity DC voltage output;
   (d) conduits from said AC voltage source and said switch means for the AC voltage and for the alternating polarity DC voltage output;
   (e) coupling means for coupling the output of said AC voltage source and said alternating polarity DC voltage output from said switch means, said coupling means including isolation means in said conduits from said AC voltage source and said DC voltage switch means to isolate said sources from each other, whereby said alternating polarity DC voltage and AC voltage are superimposed to produce an alternating polarity DC-biased AC voltage;
   (f) means for introducing said alternating polarity DC-biased AC voltage into a cable installation to produce indications of incipient faults in said cable installation; and
   (g) means for monitoring the alternating polarity DC-biased AC voltage.

10. The test apparatus in accordance with claim 9 wherein said isolation means includes an AC coupling capacitor in the alternating current conduit and resistors in the direct current conduit from said switch means.

11. The test apparatus in accordance with claim 9 wherein said switch means is a switch controlled by an adjustable timer.

12. In a method for testing high voltage cable installation, the steps comprising:
(a) providing a high AC voltage source of the frequency range intended to be carried by said cable installation;
(b) providing a high DC voltage source;
(c) alternating the high DC voltage between positive and negative polarities;
(d) superimposing said AC voltage and said alternating polarity DC voltage while isolating said sources from each other to produce an alternating polarity DC-biased AC voltage; and
(e) injecting said alternating polarity DC-biased AC voltage into said cable installation to produce an indication of incipient faults in said cable installation.

13. The testing method in accordance with claim 12 wherein said providing DC and AC voltage source steps include passing current from said AC voltage source through a transformer to increase the voltage.

14. The testing method in accordance with claim 12 wherein said transformer increases the voltage of said AC voltage and of said DC voltage.

15. The testing method in accordance with claim 12 in which the alternating step is effected by switching between positive and negative potentials at a frequency controlled by an adjustable timer.

16. The testing method in accordance with claim 12 including the step of monitoring said alternating polarity DC-biased AC voltage.

* * * * *